(12) United States Patent
Suk et al.

(10) Patent No.: US 9,123,774 B2
(45) Date of Patent: Sep. 1, 2015

(54) SEMICONDUCTOR DEVICES AND METHODS OF FABRICATING THE SAME

(71) Applicant: Samsung Electronics Co., Ltd., Suwon-si (KR)

(72) Inventors: Sung-Dae Suk, Seoul (KR); Heesoo Kang, Seoul (KR); Sungil Park, Suwon-si (KR); Changwoo Oh, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/162,481

(22) Filed: Jan. 23, 2014

(65) Prior Publication Data
US 2014/0203348 A1 Jul. 24, 2014

(30) Foreign Application Priority Data

Jan. 23, 2013 (KR) .................. 10-2013-0007573

(51) Int. Cl.
*H01L 29/66* (2006.01)
*H01L 29/40* (2006.01)
*H01L 21/3205* (2006.01)
*H01L 21/764* (2006.01)
*H01L 29/78* (2006.01)

(52) U.S. Cl.
CPC ........ *H01L 21/764* (2013.01); *H01L 29/66545* (2013.01); *H01L 29/66795* (2013.01); *H01L 29/785* (2013.01)

(58) Field of Classification Search
CPC .................. H01L 29/0653; H01L 29/7856
USPC ........................................ 257/327; 438/595
See application file for complete search history.

(56) References Cited

U.S. PATENT DOCUMENTS

| | | | |
|---|---|---|---|
| 5,914,519 A | 6/1999 | Chou et al. | |
| 6,001,695 A | 12/1999 | Wu | |
| 6,015,746 A | 1/2000 | Yeh et al. | |
| 6,015,749 A | 1/2000 | Liu et al. | |
| 6,180,988 B1 | 1/2001 | Wu | |
| 6,468,877 B1 | 10/2002 | Pradeep et al. | |
| 7,282,423 B2 | 10/2007 | Furukawa et al. | |

(Continued)

FOREIGN PATENT DOCUMENTS

| | | |
|---|---|---|
| JP | 2003-258244 | 9/2003 |
| JP | 2007-180390 | 7/2007 |

(Continued)

*Primary Examiner* — Daniel Shook
*Assistant Examiner* — Moazzam Hossain
(74) *Attorney, Agent, or Firm* — Myers Bigel Sibley & Sajovec, PA

(57) ABSTRACT

Provided is a semiconductor device, which includes a gate electrode crossing over a semiconductor fin disposed on a substrate, a gate dielectric layer disposed between the gate electrode and the semiconductor fin, a channel region having a three dimensional structure defined in the semiconductor fin under the gate electrode, impurity regions disposed in the semiconductor fin at both sides of the gate electrode and spaced apart from the gate electrode, a first interlayer dielectric layer covering an entire surface of the substrate, except for the gate electrode, first contact plugs passing through the first interlayer dielectric layer and contacting the impurity regions, and a second interlayer dielectric layer covering the gate electrode and partially filling a space between the gate electrode and the impurity regions to define an air gap between the gate electrode and the impurity regions.

12 Claims, 20 Drawing Sheets

(56) References Cited

U.S. PATENT DOCUMENTS

| | | |
|---|---|---|
| 7,691,712 B2 | 4/2010 | Chidambarrao et al. |
| 7,838,373 B2 | 11/2010 | Giles et al. |
| 7,939,895 B2 | 5/2011 | Fukasaku |
| 8,637,930 B2 * | 1/2014 | Ando et al. .................. 257/347 |

FOREIGN PATENT DOCUMENTS

| | | |
|---|---|---|
| JP | 2008-041886 | 2/2008 |
| KR | 10-2001-0073571 A | 8/2001 |
| KR | 10-2005-0121521 A | 12/2005 |
| KR | 10-2008-0002548 A | 1/2008 |

* cited by examiner

SEMICONDUCTOR DEVICES AND METHODS OF FABRICATING THE SAME

CROSS-REFERENCE TO RELATED APPLICATIONS

This U.S. non-provisional patent application claims priority under 35 U.S.C. §119 of Korean Patent Application No. 10-2013-0007573, filed Jan. 23, 2013, the entire contents of which are hereby incorporated herein by reference.

FIELD

The present disclosure herein relates to a semiconductor device and a method of fabricating the semiconductor device, and more particularly, to a semiconductor device including a channel region having a three dimensional structure, and a method of fabricating the semiconductor device.

BACKGROUND

Semiconductor devices have characteristics, such as miniaturization, multi functions, and/or low manufacturing costs and are, thus, regarded with much interest as a core part in electronics industry. Semiconductor devices may be classified into semiconductor memory devices for storing logic data, semiconductor logic devices for processing logic data, and hybrid semiconductor devices including a memory element and a logic element. As the electronics industry is highly developed, demands on characteristics of semiconductor devices are being increased. For example, demands on high reliability, high speed, and/or multi functions of semiconductor devices are being increased. To this end, inner structures of semiconductor devices are more complicated, and the semiconductor devices are highly integrated.

As semiconductor devices are highly integrated, a channel width of metal-oxide-silicon field effect transistors (MOSFET, hereinafter, referred to as transistors) is decreased so as to decrease a driving current amount thereof.

The decrease of the driving current amount causes various issues with the semiconductor devices. For example, an operation speed of a transistor may be decreased. In addition, a data sensing margin of a semiconductor memory device using a difference in driving current amount of a transistor may be decreased.

SUMMARY

The inventive concept provides a semiconductor device which makes it possible to improve alternating current performance.

The inventive concept also provides a method of fabricating a semiconductor device which makes it possible to improve alternating current performance.

Embodiments of the inventive concept provide semiconductor devices including: a gate electrode crossing over a semiconductor fin disposed on a substrate; a gate dielectric layer disposed between the gate electrode and the semiconductor fin; a channel region having a three dimensional structure defined in the semiconductor fin under the gate electrode; impurity regions disposed in the semiconductor fin at both sides of the gate electrode and spaced apart from the gate electrode; a first interlayer dielectric layer covering an entire surface of the substrate, except for the gate electrode; first contact plugs passing through the first interlayer dielectric layer and contacting the impurity regions; and a second interlayer dielectric layer covering the gate electrode and partially filling a space between the gate electrode and the impurity regions to define an air gap between the gate electrode and the impurity regions.

In some embodiments, the second interlayer dielectric layer may have a dielectric constant lower than that of the first interlayer dielectric layer.

In other embodiments, respective top surfaces of the impurity regions may be higher than a top surface of the channel region.

In still other embodiments, the gate electrode may include: a lower gate part having a constant width; and an upper gate part having a width that gradually decreases from the lower gate part.

In even other embodiments, the second interlayer dielectric layer may partially fill a space between the lower gate part and the impurity regions.

In yet other embodiments, the gate dielectric layer may extend to a side wall of the lower gate part.

In further embodiments, the first contact plug may have a side wall that is inclined upward in a direction away from the gate electrode.

In still further embodiments, the semiconductor devices may further include: a third interlayer dielectric layer covering the second interlayer dielectric layer and the first contact plugs; and a second contact plug passing through the third interlayer dielectric layer and contacting the first contact plug.

In other embodiments of the inventive concept, methods of fabricating a semiconductor device include: forming a gate electrode crossing over a semiconductor fin disposed on a substrate, wherein a gate dielectric layer is disposed between the gate electrode and the semiconductor fin; forming impurity regions in the semiconductor fin at both sides of the gate electrode and spaced apart from the gate electrode, to define a channel region having a three dimensional structure in the semiconductor fin under the gate electrode; forming a sacrificial dielectric layer covering a side wall of the gate electrode; forming first contact plugs disposed at both the sides of the gate electrode and contacting the impurity regions; removing the sacrificial dielectric layer; and forming a capping interlayer dielectric layer that covers the gate electrode and partially fills a space between the gate electrode and the impurity regions to define an air gap between the gate electrode and the impurity regions.

In some embodiments, the removing of the sacrificial dielectric layer may include: partially removing the sacrificial dielectric layer between the gate electrode and the first contact plugs; etching the gate electrode and the first contact plugs to widen a space formed by partially removing the sacrificial dielectric layer; and removing a portion of the sacrificial dielectric layer remaining between the gate electrode and the first contact plugs.

In other embodiments, by etching the gate electrode and the first contact plugs, the gate electrode may include: a lower gate part having a constant width; and an upper gate part having a width that gradually decreases from the lower gate part, and the first contact plug has a side wall that is inclined upward in a direction away from the gate electrode.

In still other embodiments, the capping interlayer dielectric layer may partially fill a space between the lower gate part and the impurity regions.

In even other embodiments, the gate dielectric layer may extend to a side wall of the lower gate part.

In yet other embodiments, the methods may further include forming a spacer disposed between the sacrificial dielectric layer and the first contact plug.

In further embodiments, the methods may further include: forming an upper interlayer dielectric layer covering the capping interlayer dielectric layer and the first contact plugs; and forming a second contact plug passing through the upper interlayer dielectric layer and contacting the first contact plug.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Figure 1A:
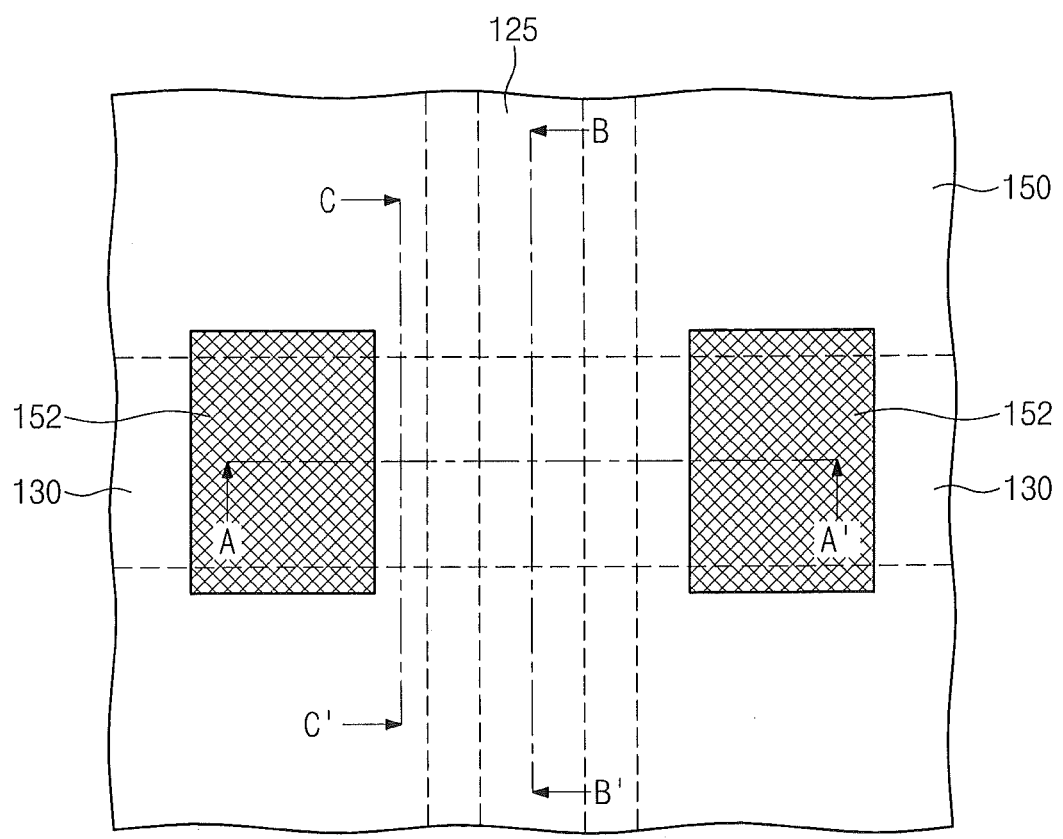
FIG. 1A is a plan view illustrating a semiconductor device according to an embodiment of the inventive concept.

Embodiments of the inventive concept will be described below in detail with reference to the accompanying drawings. The inventive concept and implementation methods thereof will be clarified through following embodiments described with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. Like reference numerals refer to like elements throughout the description.

In the following description, the technical terms are used only for explaining exemplary embodiments while not limiting the inventive concept. The terms of a singular form may include plural forms unless specifically mentioned. The meaning of 'comprises' and/or 'comprising' specifies a component, a step, an operation and/or an element but does not exclude other components, steps, operations and/or elements. Because exemplary embodiments are provided below, the order of the reference numerals given in the description is not limited thereto. In the specification, it will be understood that when a layer is referred to as being 'on' another layer or substrate, it can be directly on the layer or substrate, or intervening layers may also be present.

Additionally, the embodiments in the detailed description may be described with cross-sectional views and/or plan views as ideal exemplary views of the inventive concept. In the figures, the dimensions of layers and regions are exaggerated for clarity of illustration. Accordingly, shapes of the exemplary views may be modified according to manufacturing techniques and/or allowable tolerances. Therefore, the embodiments of the inventive concept are not limited to the specific shape illustrated in the exemplary views, but may include other shapes that may be created according to manufacturing processes. For example, an etched region illustrated as a rectangle may have rounded or curved features. Thus, areas exemplified in the drawings have general properties, and are used to illustrate a specific shape of a device region. Accordingly, this should not be construed as limiting the scope of the inventive concept.

Figure 1B:
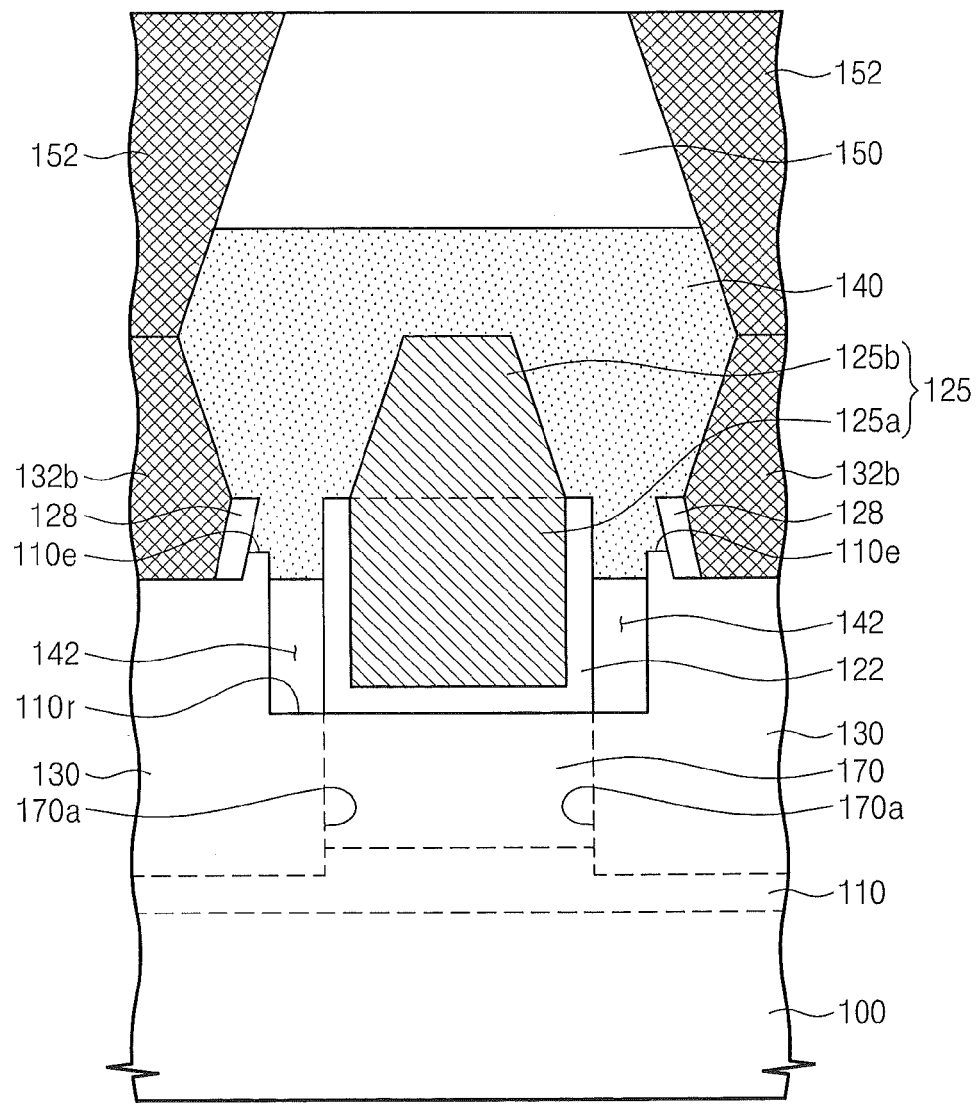
FIGS. 1B, 1C, and 1D are cross-sectional views taken along line A-A', line B-B', and line C-C' of FIG. 1A, respectively.
Figure 1C:
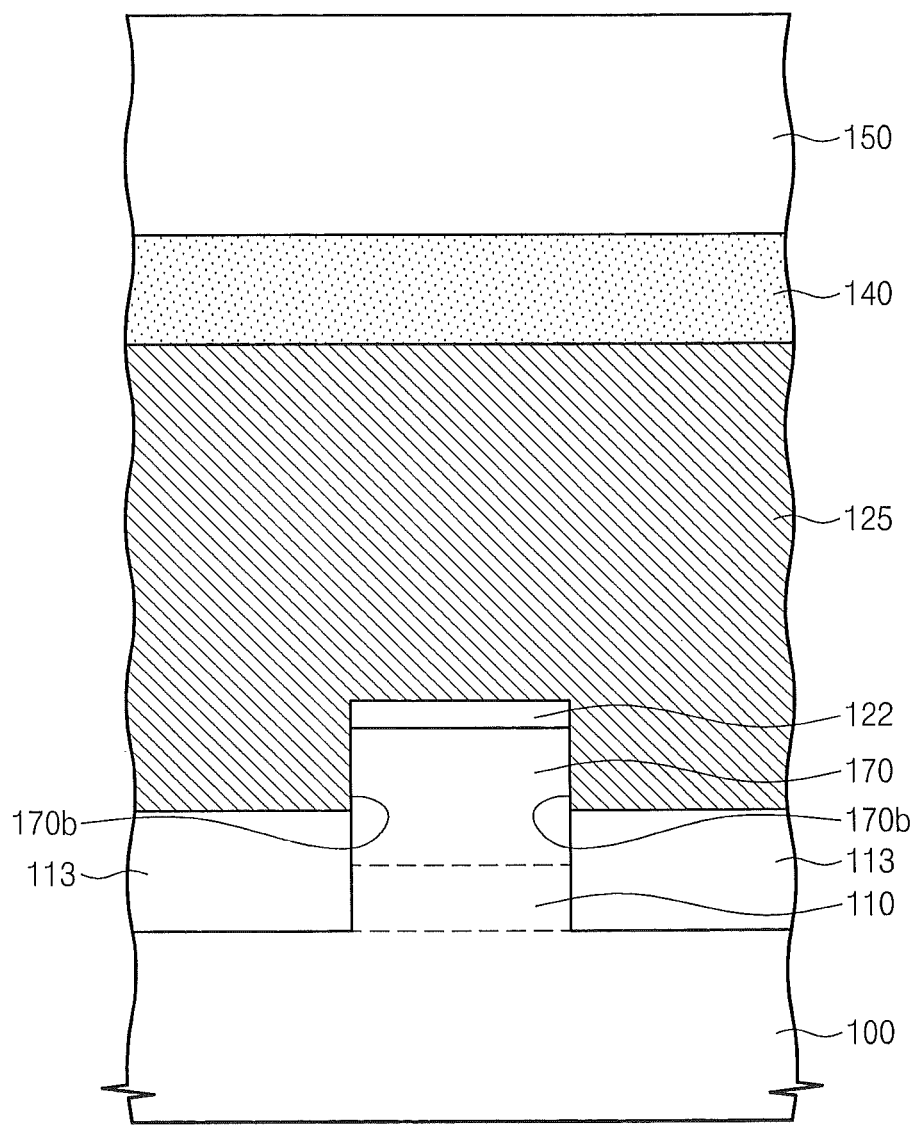
Figure 1D:
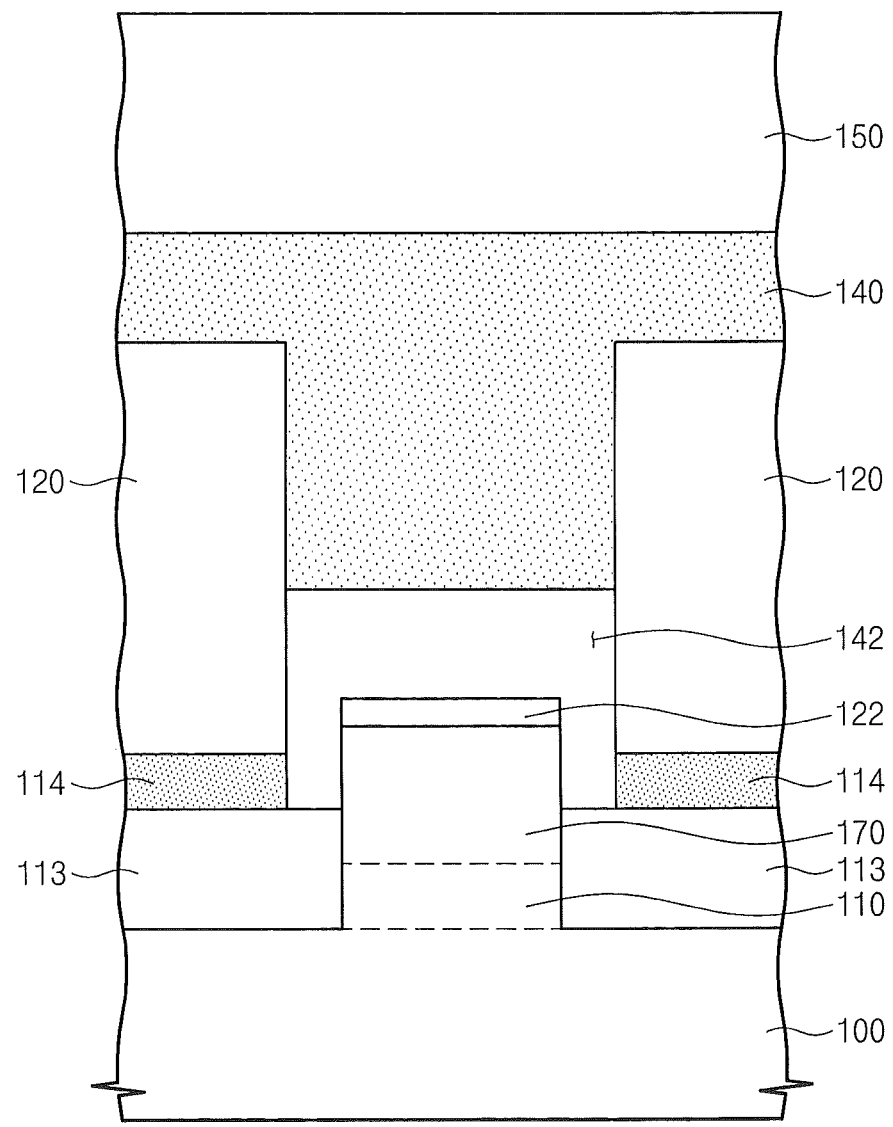

FIG. 1A is a plan view illustrating a semiconductor device according to an embodiment of the inventive concept. FIGS. 1B, 1C, and 1D are cross-sectional views taken along line A-A', line B-B', and line C-C' of FIG. 1A, respectively.

Referring to FIGS. 1A to 1D, a semiconductor fin 110 having a three dimensional structure is disposed on a substrate 100. An upper edge of the semiconductor fin 110 is illustrated as a rectangle, for convenience in description. Alternatively, the upper edge of the semiconductor fin 110 may be rounded. The substrate 100 may be a semiconductor substrate. A bottom surface of the semiconductor fin 110 may contact the substrate 100. Alternatively, the semiconductor fin 110 may be disposed on a buried dielectric layer (not shown) disposed on the substrate 100. That is, the semiconductor fin 110 may be formed from a semiconductor layer disposed on the buried dielectric layer of a semiconductor on insulator (SOI) substrate. The semiconductor fin 110 contacts the substrate 100 in the following detailed descriptions. It will be understood that similar embodiments may include an SOI substrate.

An isolation pattern 113 is disposed on the substrate 100 around the semiconductor fin 110. The isolation pattern 113 may surround a side surface of a lower part of the semiconductor fin 110. The isolation pattern 113 may be formed of a silicon oxide.

A gate electrode 125 crosses over the semiconductor fin 110, and a gate dielectric layer 122 is disposed between the gate electrode 125 and the semiconductor fin 110. The gate electrode 125 includes at least one material selected from doped polysilicon as a conductive material, a metal (e.g., tungsten (W) or molybdenum (Mo)), a conductive metal nitride (e.g., a titanium nitride (TiN) or a tantalum nitride ($Ta_3N_5$)), and a metal silicide (e.g., a tungsten silicide ($WSi_2$) or a cobalt silicide ($CoSi_2$)). For example, the gate electrode 125 may be formed of tungsten. The gate dielectric layer 122 may include a silicon oxide formed using a chemical vapor deposition (CVD) method.

The gate electrode 125 may include a lower gate part 125a having a constant width and an upper gate part 125b having a width that gradually decreases from the lower gate part 125a. That is, the upper gate part 125b of the gate electrode 125 may have a side wall that is inclined upward. The gate dielectric layer 122 may extend to a side wall of the lower gate part 125a. That is, the lower gate part 125a of the gate electrode 125 may be surrounded by the gate dielectric layer 122. The portion of the gate dielectric layer 122, which extends to the side wall of the lower gate part 125a, may function as a spacer.

Impurity regions 130 are disposed in the semiconductor fin 110 at both sides of the gate electrode 125 and are spaced apart from the gate electrode 125. A pair of the impurity regions 130, disposed at both the sides of the gate electrode 125 and individually spaced apart from the gate electrode 125, correspond to source/drain regions of a fin transistor. A channel region 170 having a three dimensional structure is defined in the semiconductor fin 110 under the gate electrode 125. Respective top surfaces of the impurity regions 130 may be higher than a top surface of the channel region 170. That is, the fin transistor may have elevated source/drain regions.

The channel region 170 is defined by the semiconductor fin 110 between the pair of the impurity regions 130. The channel region 170 includes: a pair of first side surfaces 170a contacting the impurity regions 130, respectively; and a pair of second side surfaces 170b perpendicular to the first side surfaces 170a and facing each other. The gate electrode 125 covers the top surface of the channel region 170 and the second side surfaces 170b. The gate electrode 125 and the impurity regions 130 constitute the fin transistor.

A first interlayer dielectric layer 120 covers an entire surface of the substrate 100 except for a portion corresponding to the gate electrode 125. That is, the first interlayer dielectric layer 120 covers the entire surface of the substrate 100 and the impurity regions 130, and exposes the portion corresponding to the gate electrode 125. The first interlayer dielectric layer 120 may be formed of a silicon oxide.

First contact plugs 132b pass through the first interlayer dielectric layer 120 and contact the impurity regions 130. The first contact plugs 132b may include a conductive material having a resistivity lower than that of the impurity regions 130. For example, the first contact plug 132b may include at least one material selected from a conductive metal nitride (e.g., a titanium nitride or a tantalum nitride), a metal (e.g., titanium (Ti), tantalum (Ta), tungsten (W), aluminum (Al), or copper (Cu)), and a metal silicide (e.g., a titanium silicide (TiSi2) or a tantalum silicide (TaSi2)). For example, the first contact plug 132b may be formed of tungsten. The first contact plug 132b may have a pillar shape. The first contact plug 132b may have a side wall that is inclined upward in a direction away from the gate electrode 125.

A second interlayer dielectric layer 140 covers the gate electrode 125 and partially fills spaces between the gate electrode 125 and the impurity regions 130, thereby defining air gaps 142 between the gate electrode 125 and the impurity regions 130. In addition, the second interlayer dielectric layer 140 may partially fill a space between a portion of the first interlayer dielectric layer 120 disposed on the semiconductor fin 110, and a portion of the first interlayer dielectric layer 120 disposed on the isolation pattern 113, thereby defining another air gap 142 between the portions of the first interlayer dielectric layer 120 (refer to FIG. 1D). That is, the second interlayer dielectric layer 140 may partially fill a space between the first interlayer dielectric layer 120 and the pair of the first side surfaces 170a contacting the pair of the impurity regions 130, respectively, thereby defining another air gap 142 on the pair of the first side surfaces 170a. The second interlayer dielectric layer 140 may partially fill spaces between the impurity regions 130 and the lower gate part 125a of the gate electrode 125. That is, an upper portion of the air gaps 142 may be lower than an upper portion of the lower gate part 125a of the gate electrode 125. The second interlayer dielectric layer 140 may include a material having a dielectric constant lower than that of the first interlayer dielectric layer 120. A top surface of the second interlayer dielectric layer 140 may be higher than a top surface of the first contact plugs 132b.

A third interlayer dielectric layer 150 covers the second interlayer dielectric layer 140 and the first contact plugs 132b. The third interlayer dielectric layer 150 may be formed of a silicon oxide. Second contact plugs 152 pass through the third interlayer dielectric layer 150 and contact the first contact plugs 132b. The second contact plugs 152 may include a conductive material having a resistivity lower than that of the impurity regions 130. For example, the second contact plug 152 may include at least one material selected from a conductive metal nitride (e.g., a titanium nitride or a tantalum nitride), a metal (e.g., titanium, tantalum, tungsten, aluminum, or copper), and a metal silicide (e.g., a titanium silicide or a tantalum silicide). For example, the second contact plug 152 may be formed of tungsten. The second contact plug 152 may have a pillar shape. The second contact plug 152 may have a side wall that is inclined downward in the direction away from the gate electrode 125.

A semiconductor device according to the current embodiment may include the air gaps 142 defined between the semiconductor fin 110 and the lower gate part 125a of the gate electrode 125, thereby reducing or minimizing a fringing field. Thus, a capacitance according to the fringing field is reduced or minimized, thereby providing a semiconductor device having an improved alternating current performance.

In addition, the second interlayer dielectric layer 140 having a low dielectric constant is disposed between the first contact plugs 132b and the upper gate part 125b of the gate electrode 125, and the distances between the first contact plugs 132b and the upper gate part 125b of the gate electrode 125 are large, thereby reducing or minimizing parasitic capacitance therebetween. Because the parasitic capacitance is reduced or minimized, a semiconductor device having an improved alternating current performance can be provided.

FIGS. 2 to 14 are cross-sectional views illustrating a method of fabricating a semiconductor device according to the current embodiment, which are taken along line A-A' of FIG. 1A.

Figure 2:
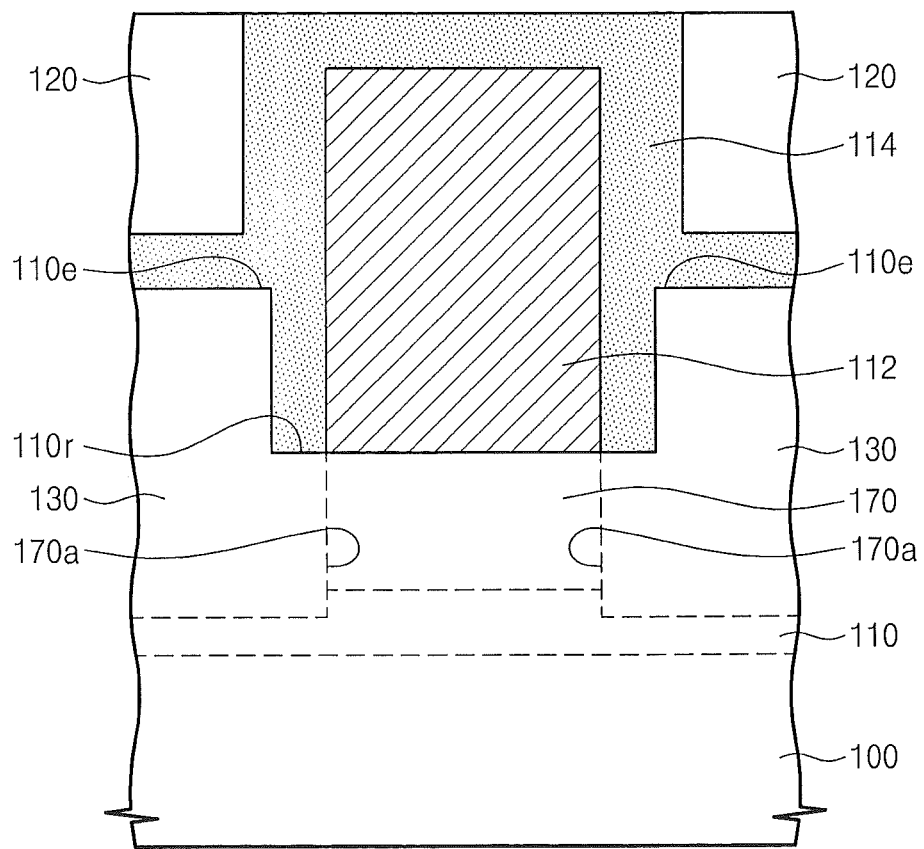
FIGS. 2 to 14 are cross-sectional views illustrating a method of fabricating a semiconductor device according to an embodiment of the inventive concept, which are taken along line A-A' of FIG. 1A.

Referring to FIG. 2, a hard mask pattern (not shown) is formed on a predetermined region of a substrate 100, and then the substrate 100 is etched through an etch process using the hard mask pattern as a mask, thereby forming a semiconductor fin 110. The substrate 100 may be a bulk substrate or an SOI substrate. The hard mask pattern may include a material having an etch selectivity with respect to the substrate 100, e.g., a silicon nitride (SiN). The hard mask pattern may include a buffer oxide film (not shown) disposed between the substrate 100 and the hard mask pattern.

A device isolation layer is formed on an entire surface of the substrate 100 and is planarized until the hard mask pattern is exposed. Then, the planarized device isolation layer is recessed to thereby form the isolation pattern 113 (refer to FIG. 1C or 1D) surrounding a lower part of the semiconductor fin 110. The hard mask pattern is removed. For example, the hard mask pattern may be removed after the planarized device isolation layer is formed.

Before the device isolation layer is formed, a trimming process may be performed on the semiconductor fin 110. The trimming process includes an oxidization process and a process of removing an oxidized portion of the semiconductor fin 110, to smoothen a side surface of the semiconductor fin 110 and adjust a width of the semiconductor fin 110. The trimming process may be repeatedly performed one or more times.

Although not shown, an upper edge of the semiconductor fin 110 may be rounded. To this end, the trimming process may be performed. Alternatively, after the hard mask pattern is removed and the isolation pattern 113 is formed, an oxidization process and a cleaning process may be repeatedly performed on the semiconductor fin 110 one or more times to round the upper edge of the semiconductor fin 110.

The semiconductor fin 110 may have a recessed part 110r and elevated parts 110e at both sides of the recessed part 110r by recessing a predetermined region of the semiconductor fin 110 on the substrate 100.

A sacrificial gate electrode 112, which crosses over the recessed part 110r of the semiconductor fin 110, is formed.

That is, the sacrificial gate electrode 112 may be spaced apart from the elevated parts 110e of the semiconductor fin 110. The sacrificial gate electrode 112 may be formed of polysilicon. Impurity regions 130 may be formed in the elevated parts 110e of the semiconductor fin 110 through an ion implantation process using the sacrificial gate electrode 112 as a mask. The pair of the impurity regions 130, which are spaced apart, respectively, from both sides of the sacrificial gate electrode 112, correspond to source/drain regions of a fin transistor. That is, the fin transistor may have elevated source/drain regions. The impurity regions 130 define the channel region 170 having a three dimensional structure in the semiconductor fin 110 under the sacrificial gate electrode 112.

A sacrificial dielectric layer 114 is formed to conform to a profile of both the substrate 100 and the sacrificial gate electrode 112 crossing over the semiconductor fin 110. The sacrificial dielectric layer 114 may cover the entire surface of the substrate 100 in substantially uniform thickness and fill spaces between the sacrificial gate electrode 112 and the impurity regions 130. The sacrificial dielectric layer 114 may be a silicon nitride layer formed using a chemical vapor deposition (CVD) method or a physical vapor deposition (PVD) method.

The first interlayer dielectric layer 120, which covers the sacrificial dielectric layer 114, is formed. The first interlayer dielectric layer 120 may be formed of a silicon oxide. The first interlayer dielectric layer 120 is planarized until the sacrificial dielectric layer 114 is exposed.

Figure 3:
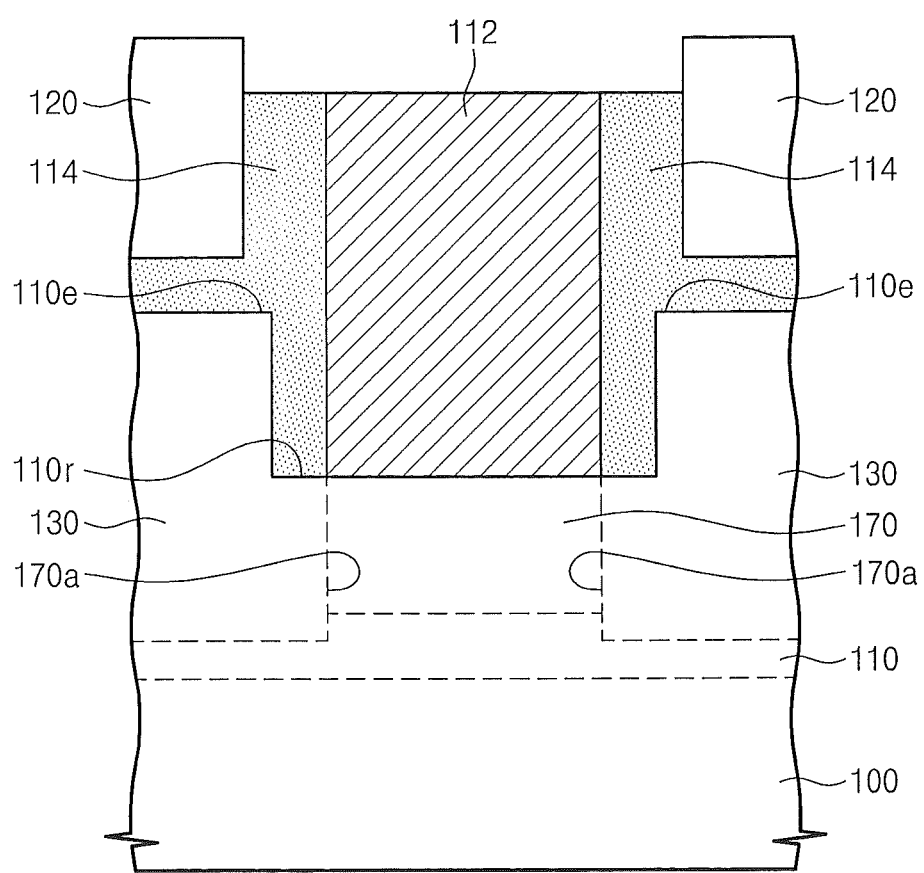

Referring to FIG. 3, a portion of the sacrificial dielectric layer 114 covering a top surface of the sacrificial gate electrode 112 is removed through an etchback process, to thereby expose the top surface thereof.

Figure 4:
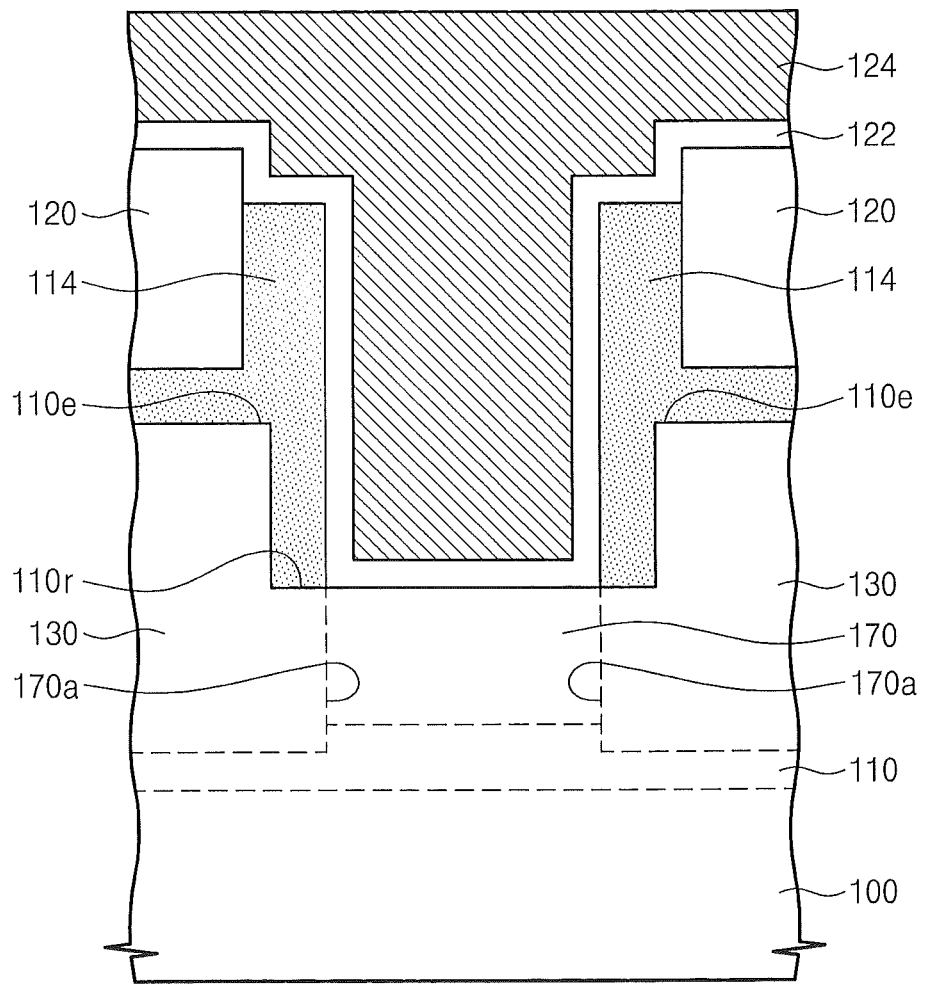

Referring to FIG. 4, the sacrificial gate electrode 112 having the exposed top surface is removed. A gate dielectric layer 122 is formed to conform to a profile of the substrate 100 with the sacrificial gate electrode 112 removed. The gate dielectric layer 122 may be a silicon oxide layer formed using a chemical vapor deposition method.

A gate electrode layer 124, which covers the entire surface of the substrate 100 and the gate dielectric layer 122, is formed. The gate electrode layer 124 may include at least one material selected from a metal as a conductive material (e.g., tungsten (W) or molybdenum (Mo)), a conductive metal nitride (e.g., a titanium nitride (TiN) or a tantalum nitride ($Ta_3N_5$)), and a metal silicide (e.g., a tungsten silicide ($WSi_2$) or a cobalt silicide ($CoSi_2$)). For example, the gate electrode layer 124 may be formed of tungsten.

Figure 5:
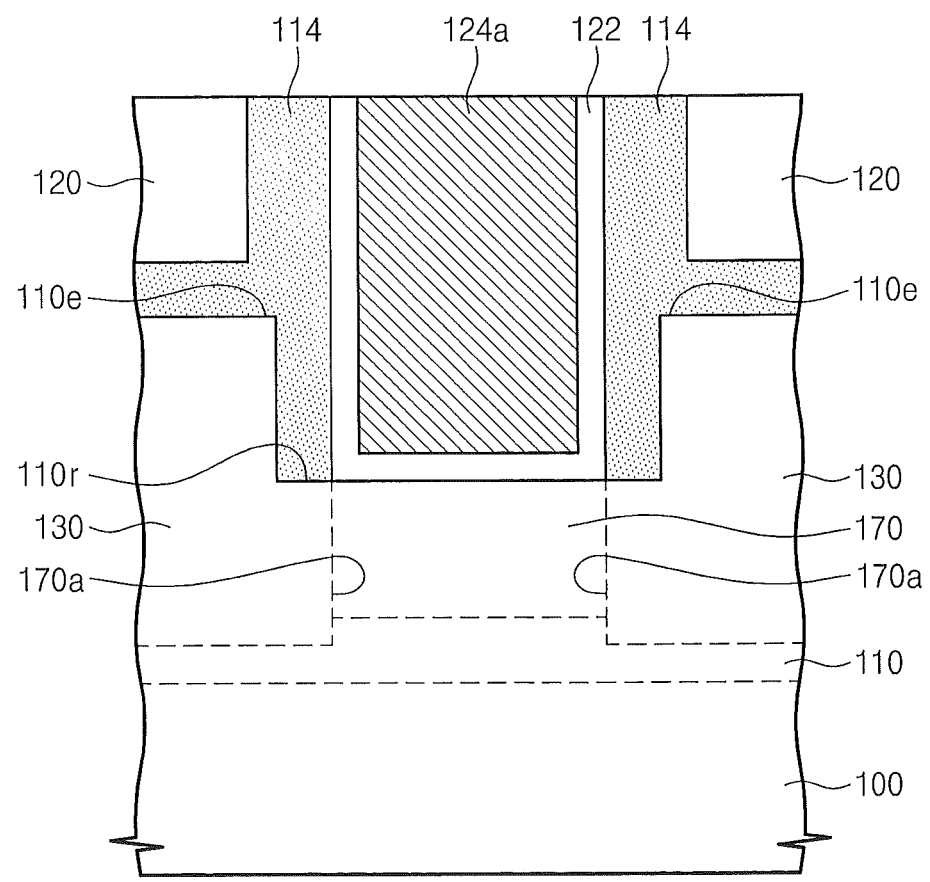

Referring to FIG. 5, the gate electrode layer 124, the gate dielectric layer 122, and the first interlayer dielectric layer 120 are planarized until the sacrificial dielectric layer 114 is exposed. Accordingly, a preliminary gate electrode 124a with a top surface exposed may be formed. In addition, the preliminary gate electrode 124a may be surrounded by the gate dielectric layer 122. A portion of the gate dielectric layer 122 surrounding a side wall of the preliminary gate electrode 124a may function as a spacer.

Figure 6:
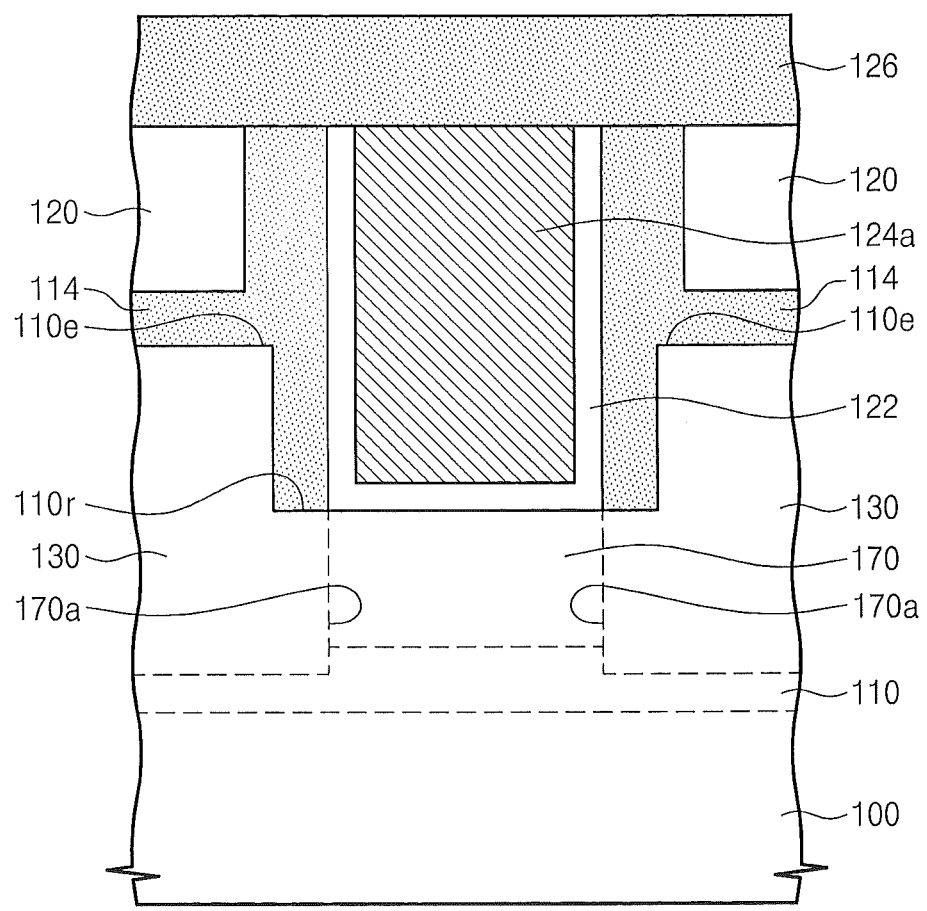

Referring to FIG. 6, a capping layer 126, which covers the entire surface of the substrate 100 and the preliminary gate electrode 124a, is formed. The capping layer 126 may be formed of the same material as that of the sacrificial dielectric layer 114. That is, the capping layer 126 may be formed of a silicon nitride.

Figure 7:
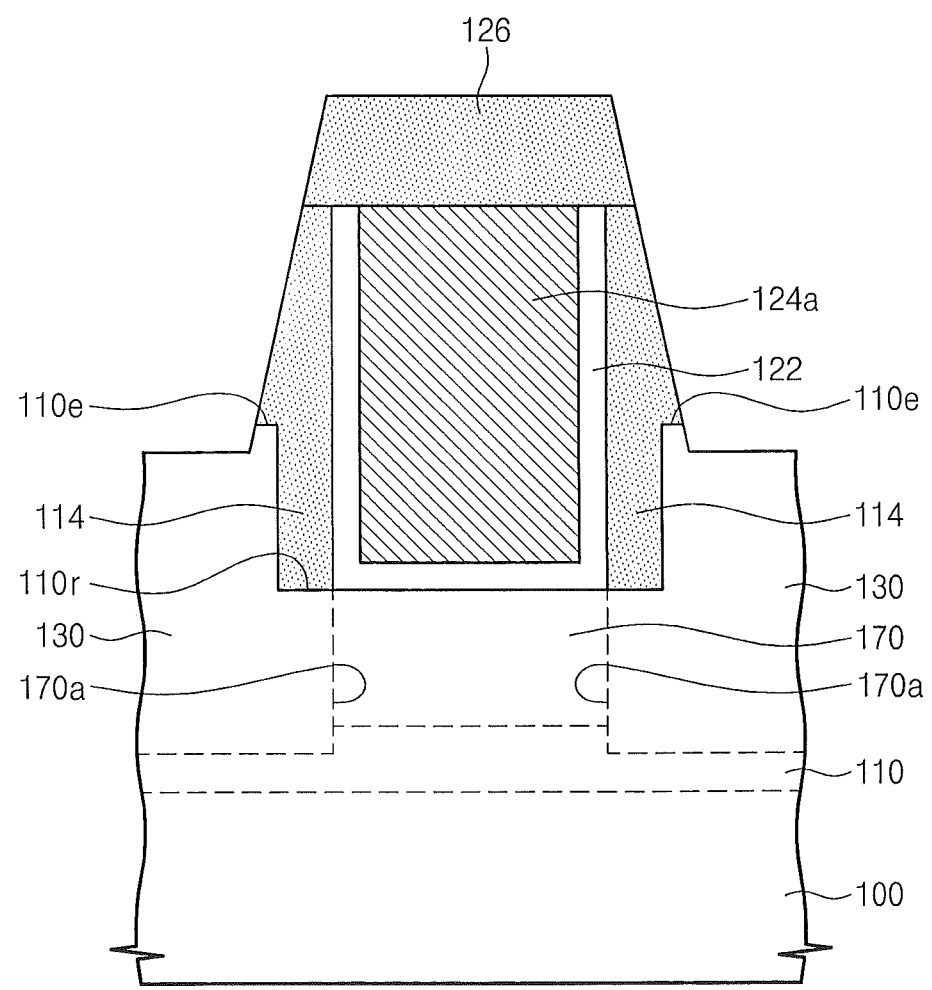

Referring to FIG. 7, a mask pattern (not shown) is formed on a portion of the capping layer 126 on the preliminary gate electrode 124a, and the capping layer 126, the sacrificial dielectric layer 114, the first interlayer dielectric layer 120, and the impurity regions 130 are partially etched through an etch process using the mask pattern as a mask, thereby exposing the impurity regions 130. According to the etch process, the capping layer 126 and the sacrificial dielectric layer 114 may have side walls that are inclined upward toward the preliminary gate electrode 124a. The mask pattern is removed.

Figure 8:
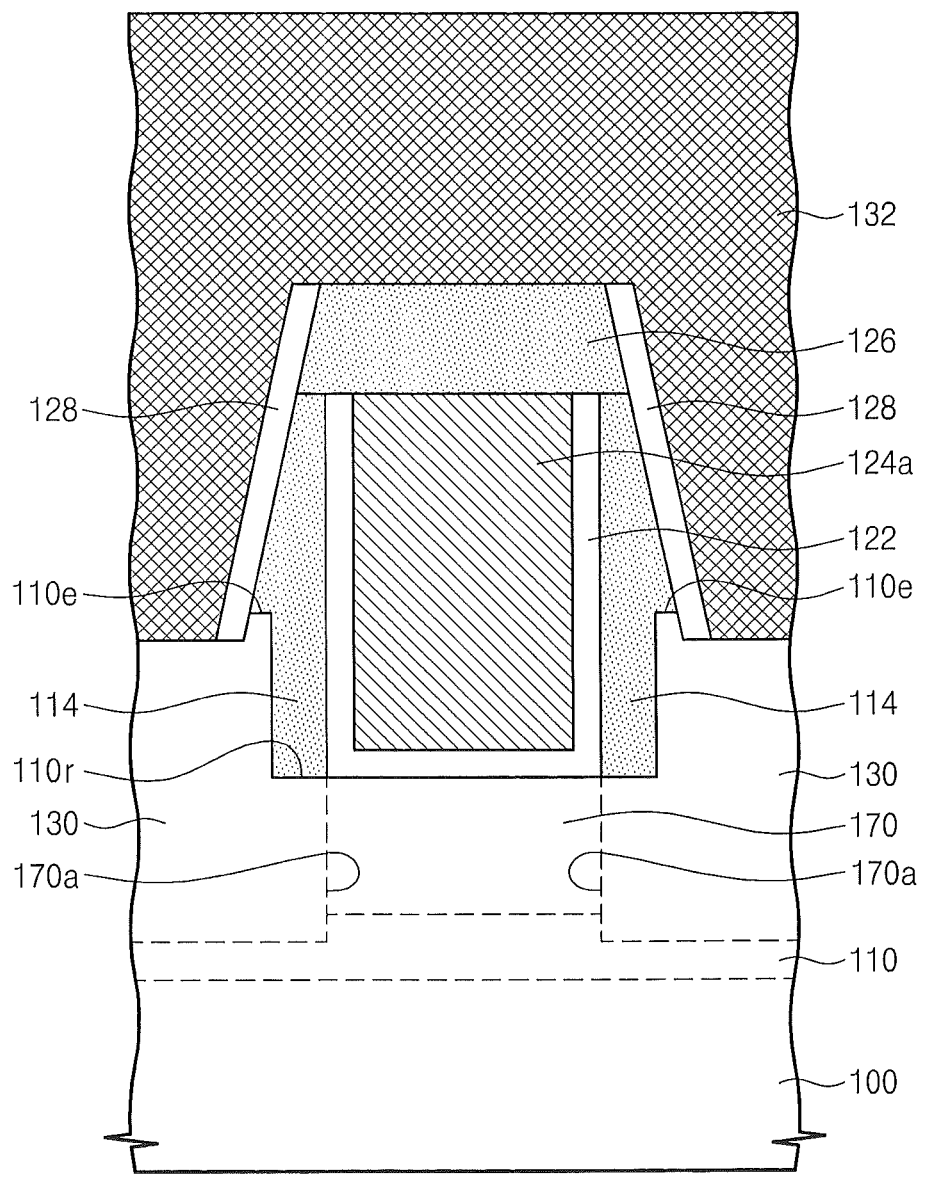

Referring to FIG. 8, a spacer layer, which covers the substrate 100 with the impurity regions 130 exposed, is formed. The spacer layer may be formed of the same material as that of the gate dielectric layer 122. That is, the spacer layer may be formed of a silicon oxide. Side walls of the capping layer 126 covering an upper part of the preliminary gate electrode 124a, and the sacrificial dielectric layer 114 covering side walls of the preliminary gate electrode 124a are covered with spacers 128 that are formed by etching the spacer layer.

A first contact plug layer 132, which covers the substrate 100 and the spacers 128, is formed. The first contact plug layer 132 may include a conductive material having a resistivity lower than that of the impurity regions 130. For example, the first contact plug layer 132 may include at least one material selected from a conductive metal nitride (e.g., a titanium nitride or a tantalum nitride), a metal (e.g., titanium, tantalum, tungsten, aluminum, or copper), and a metal silicide (e.g., a titanium silicide or a tantalum silicide). For example, the first contact plug layer 132 may be formed of tungsten.

Figure 9:
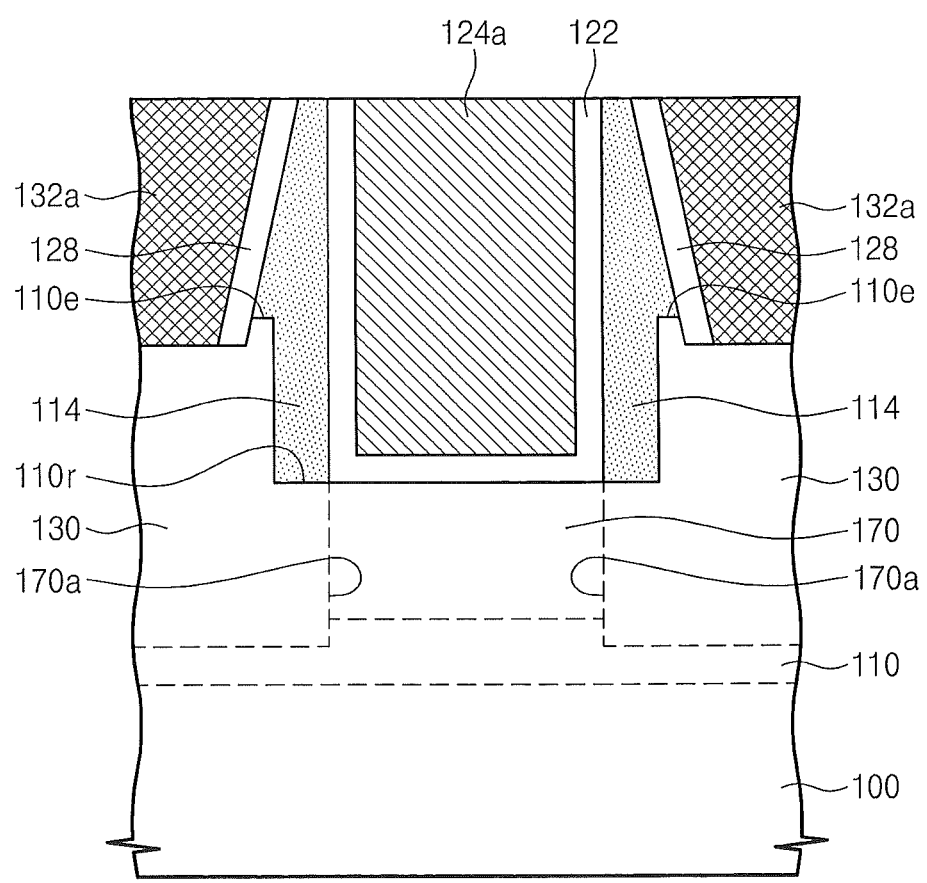

Referring to FIG. 9, the first contact plug layer 132, the capping layer 126, and the spacers 128 are planarized until the preliminary gate electrode 124a is exposed. Accordingly, the preliminary gate electrode 124a with the top surface exposed, and preliminary first contact plugs 132a with top surfaces exposed may be formed. Accordingly, the gate dielectric layer 122, which surrounds a bottom surface and side walls of the preliminary gate electrode 124a may be formed. In addition, the preliminary first contact plugs 132a, which cover side walls of the sacrificial dielectric layer 114 with the spacers 128 therebetween, may be formed.

Figure 10:
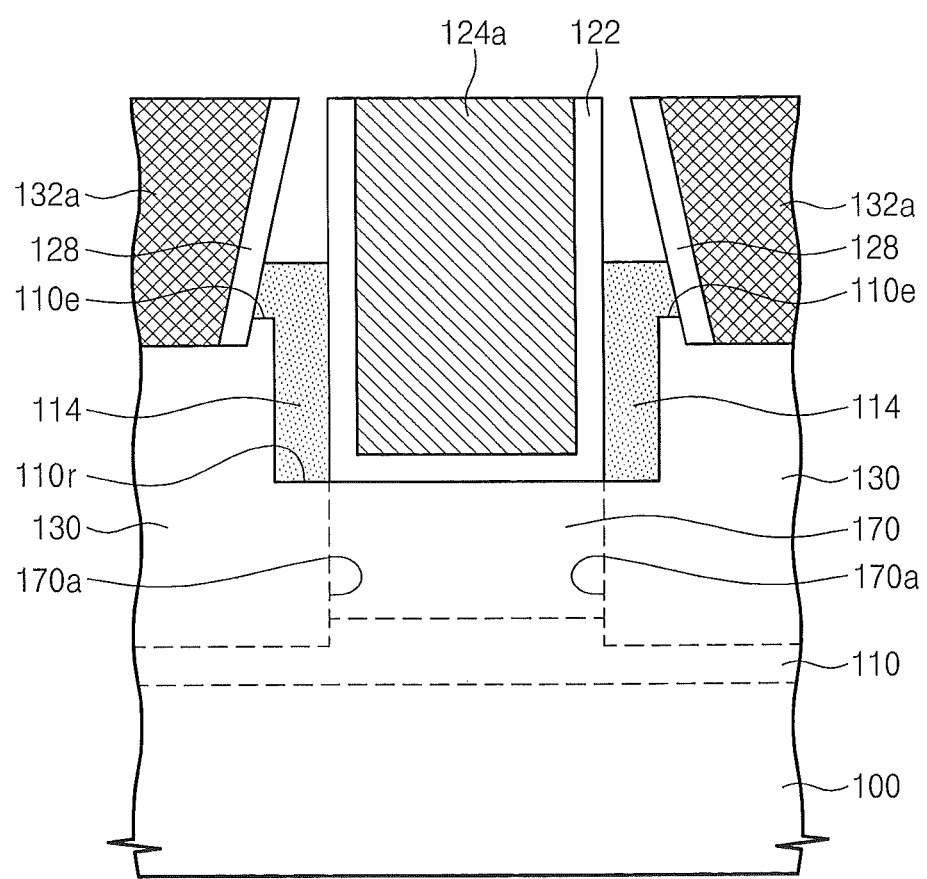

Referring to FIG. 10, the sacrificial dielectric layer 114 is partially removed between the preliminary gate electrode 124a and the preliminary first contact plugs 132a. Because the sacrificial dielectric layer 114 formed of a silicon nitride has an etch selectivity with respect to the gate dielectric layer 122 and the spacers 128, which are formed of a silicon oxide, and the preliminary gate electrode 124a and the preliminary first contact plugs 132a, which are formed of a conductive material, the sacrificial dielectric layer 114 is partially removed.

Figure 11:
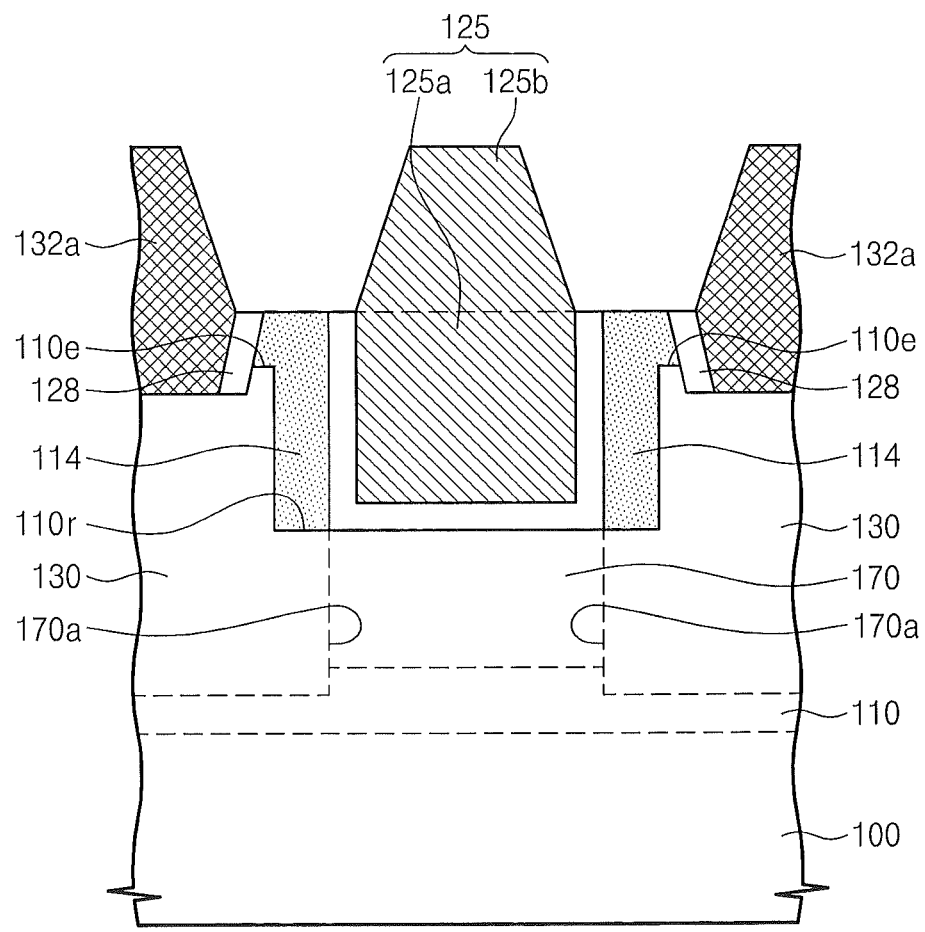

Referring to FIG. 11, the preliminary gate electrode 124a, the gate dielectric layer 122, the spacers 128, and the preliminary first contact plugs 132a are etched to widen a space formed by partially removing the sacrificial dielectric layer 114. Accordingly, the gate electrode 125, which includes a lower gate part 125a having a constant width and an upper gate part 125b having a width that gradually decreases from the lower gate part 125a, may be formed from the preliminary gate electrode 124a. In addition, the first contact plugs 132b, which have a side wall that is inclined upward in a direction away from the gate electrode 125, may be formed from the preliminary first contact plugs 132a. This is because the preliminary gate electrode 124a and the preliminary first contact plugs 132a, which are formed of a conductive material, and the gate dielectric layer 122 and the spacers 128, which are formed of a silicon oxide have an etch selectivity with respect to the sacrificial dielectric layer 114 formed of a silicon nitride. Accordingly, the gate dielectric layer 122 may have a shape to cover side walls of the lower gate part 125a of the gate electrode 125. That is, the lower gate part 125a of the gate electrode 125 may be surrounded by the gate dielectric layer 122.

Figure 12:
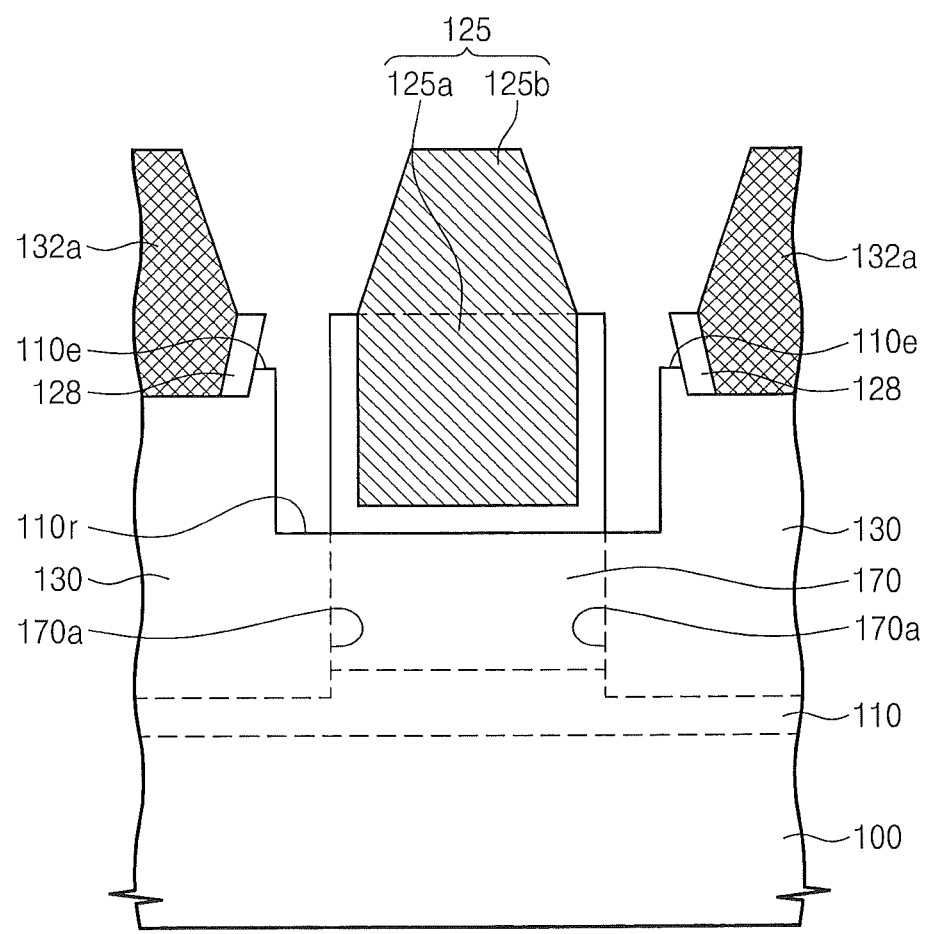

Referring to FIG. 12, a portion of the sacrificial dielectric layer 114, remaining between the gate electrode 125 and the first contact plugs 132b, is removed. At this point, as shown in FIG. 1D, a portion of the sacrificial dielectric layer 114, formed between a portion of the first interlayer dielectric layer 120, disposed on the semiconductor fin 110, and a portion of the first interlayer dielectric layer 120 disposed on the isolation pattern 113, may also be removed. That is, a portion of the sacrificial dielectric layer 114, formed between the first interlayer dielectric layer 120 and the pair of the first side surfaces 170a of the channel region 170 which contact the pair of the impurity regions 130, respectively, may also be removed.

Figure 13:
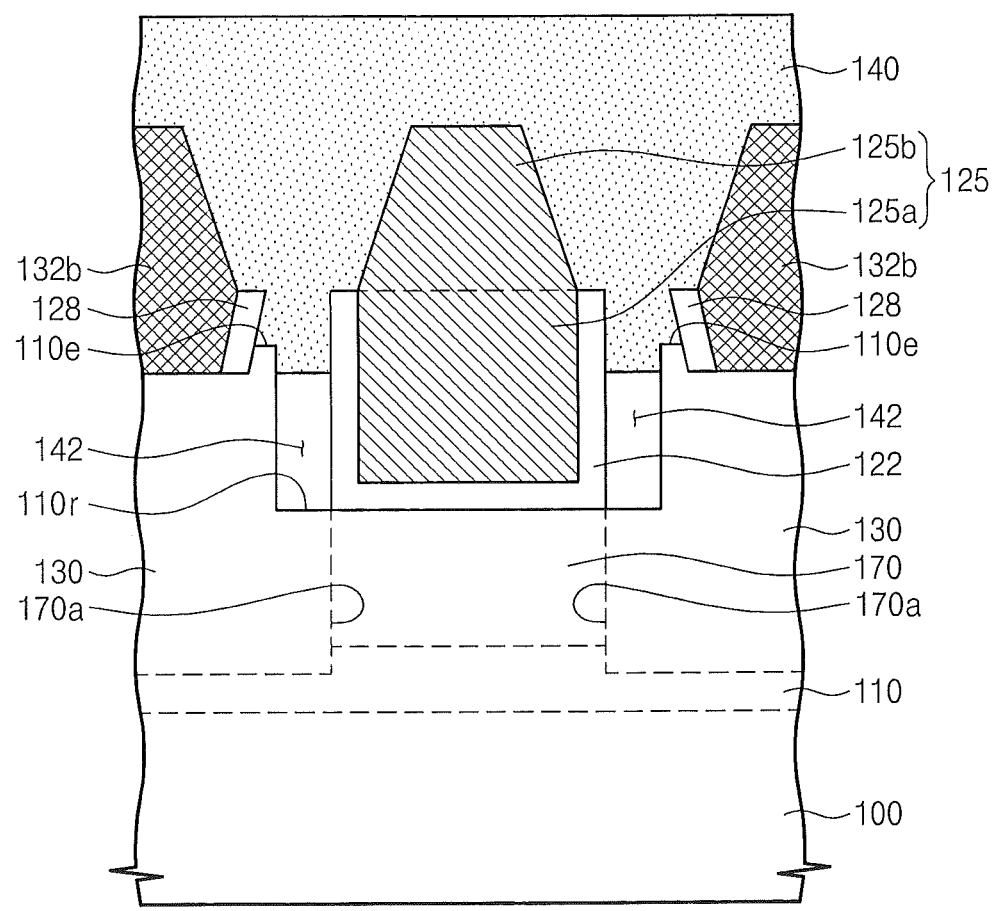

Referring to FIG. 13, a second interlayer dielectric layer 140, which covers the gate electrode 125 and partially fills spaces between the gate electrode 125 and the impurity regions 130 to thereby define air gaps 142 between the gate electrode 125 and the impurity regions 130, is formed. The second interlayer dielectric layer 140 may partially fill the spaces between the impurity regions 130 and the lower gate part 125a of the gate electrode 125. At this point, as shown in FIG. 1D, the second interlayer dielectric layer 140 may partially fill a space between the portion of the first interlayer dielectric layer 120, disposed on the semiconductor fin 110, and the portion of the first interlayer dielectric layer 120 disposed on the isolation pattern 113, thereby defining another air gap 142 between the portions of the first interlayer dielectric layer 120. That is, the second interlayer dielectric layer 140 may partially-fill a space between the first interlayer dielectric layer 120 and the pair of the first side surfaces 170a contacting the pair of the impurity regions 130, respectively, thereby defining another air gap 142 on the pair of the first side surfaces 170a.

The second interlayer dielectric layer 140 may partially fill the spaces between the impurity regions 130 and the lower gate part 125a of the gate electrode 125. That is, an upper portion of the air gap 142 may be lower than an upper portion of the lower gate part 125a of the gate electrode 125. The space formed by etching the preliminary gate electrode 124a, the gate dielectric layer 122, the spacers 128, and the preliminary first contact plugs 132a to partially remove the sacrificial dielectric layer 114 has a large width as illustrated in FIG. 11, whereas the portion of the sacrificial dielectric layer 114 removed from between the gate electrode 125 and the first contact plugs 132b has a small width as illustrated in FIG. 12. Thus, the second interlayer dielectric layer 140 has a gap-fill ability to completely fill the spaces between the first contact plugs 132b and the upper gate part 125b of the gate electrode 125 and partially fill the spaces between the impurity regions 130 and the lower gate part 125a of the gate electrode 125.

The second interlayer dielectric layer 140 may be formed of a material having a dielectric constant lower than that of the first interlayer dielectric layer 120. In addition, the second interlayer dielectric layer 140 may be formed of a material having a low step coverage or be formed using a method for providing a low step coverage. A top surface of the second interlayer dielectric layer 140 may be higher than the top surface of the first contact plugs 132b.

Figure 14:
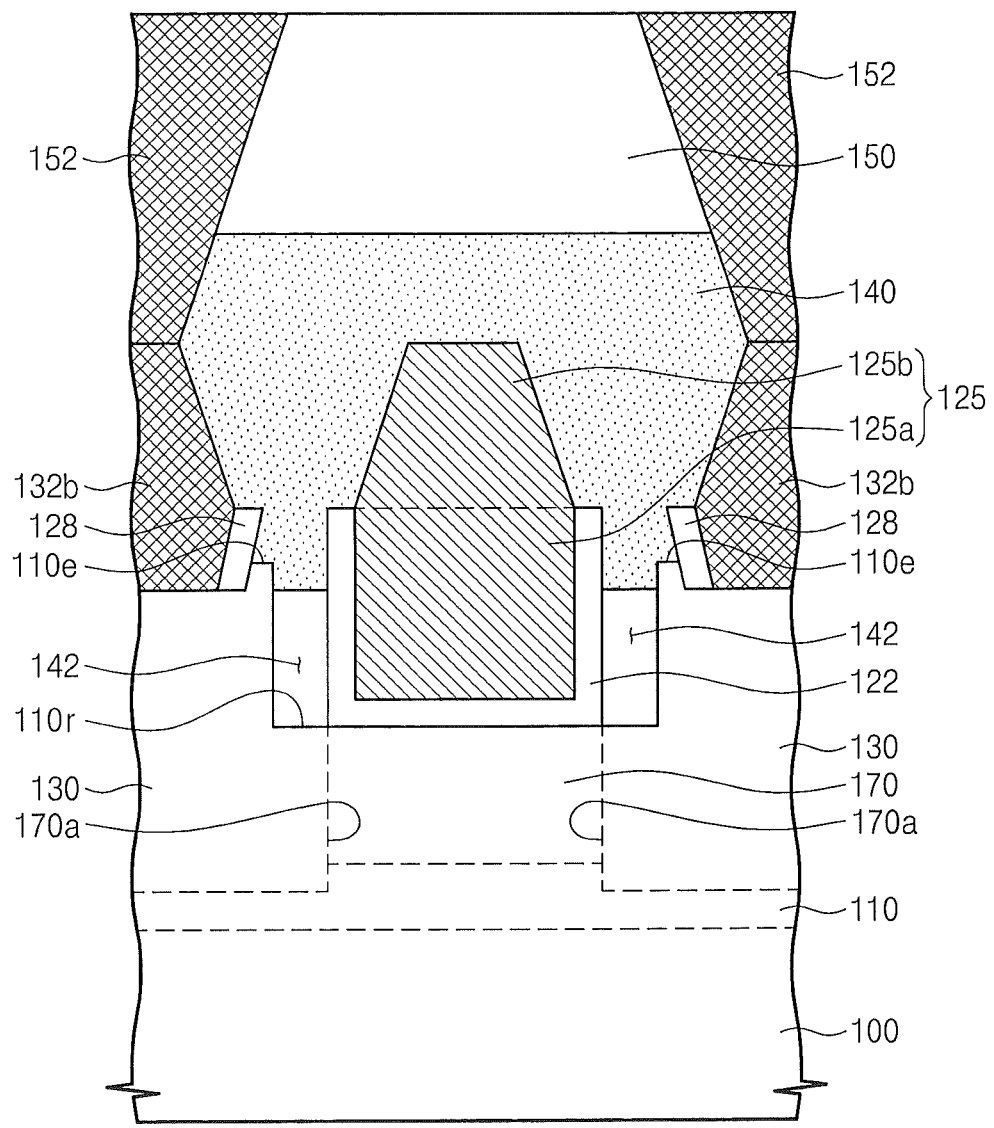

Referring to FIG. 14, a third interlayer dielectric layer 150, which covers the second interlayer dielectric layer 140 and the first contact plugs 132b, is formed. The third interlayer dielectric layer 150 may be formed of a silicon oxide.

Second contact plugs 152, which pass through the third interlayer dielectric layer 150 and contact the first contact plugs 132b, are formed. The second contact plugs 152 may include a conductive material having a resistivity lower than that of the impurity regions 130. For example, the second contact plug 152 may include at least one material selected from a conductive metal nitride (e.g., a titanium nitride or a tantalum nitride), a metal (e.g., titanium, tantalum, tungsten, aluminum, or copper), and a metal silicide (e.g., a titanium silicide or a tantalum silicide). For example, the second contact plug 152 may be formed of tungsten. The second contact plug 152 may have a side wall that is inclined downward in the direction away from the gate electrode 125.

A semiconductor device fabricated using the method according to the current embodiment may include the air gaps 142 defined between the semiconductor fin 110 and the lower gate part 125a of the gate electrode 125, thereby reducing or minimizing a fringing field. Thus, a capacitance according to the fringing field is reduced or minimized, thereby providing a semiconductor device having an improved alternating current performance.

In addition, the second interlayer dielectric layer 140 having a low dielectric constant is disposed between the first contact plugs 132b and the upper gate part 125b of the gate electrode 125, and the distances between the first contact plugs 132b and the upper gate part 125b of the gate electrode 125 are large, thereby reducing or minimizing parasitic capacitance therebetween. Because the parasitic capacitance is reduced or minimized, a semiconductor device having an improved alternating current performance can be provided.

Figure 15:
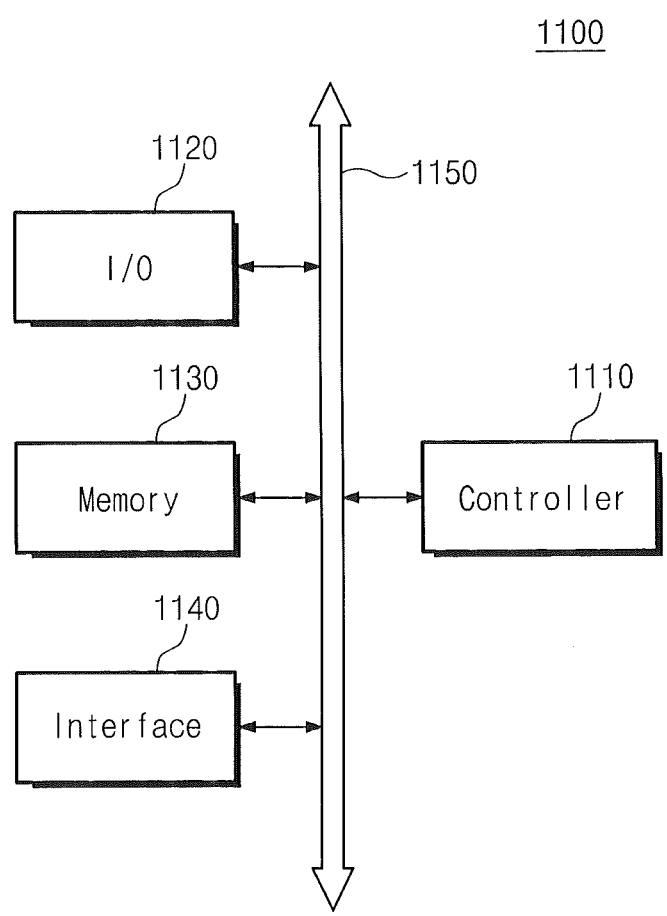
FIG. 15 is a block diagram illustrating a memory system including a semiconductor device according to an embodiment of the inventive concept.

FIG. 15 is a block diagram illustrating a memory system including a semiconductor device according to an embodiment of the inventive concept.

Referring to FIG. 15, a memory system 1100 may be applied to a personal digital assistant (PDA), a portable computer, a web tablet, a wireless phone, a mobile phone, a digital music player, a memory card, or all types of devices for transmitting and/or receiving information via a wireless environment.

The memory system 1100 includes a controller 1110, an input/output (I/O) device 1120, such as a keypad, a keyboard, and a display, a memory 1130, an interface 1140, and a bus 1150. The memory 1130 communicates with the interface 1140 through the bus 1150.

The controller 1110 may include at least one microprocessor, a digital signal processor, a microcontroller, or other process devices similar thereto. The memory 1130 may be used to store orders executed by the controller 1110. The input/output device 1120 may receive data or signals from the outside of the system 1100 or output them to the outside of the system 1100. For example, the input/output device 1120 may include a keyboard, a keypad, or a display device.

The memory 1130 includes a semiconductor device according to embodiments of the inventive concept. The memory 1130 may further include other types of memories such as a volatile memory that allows arbitrarily irregular access.

The interface 1140 transmits data to a communication network or receives data from a communication network.

Figure 16:
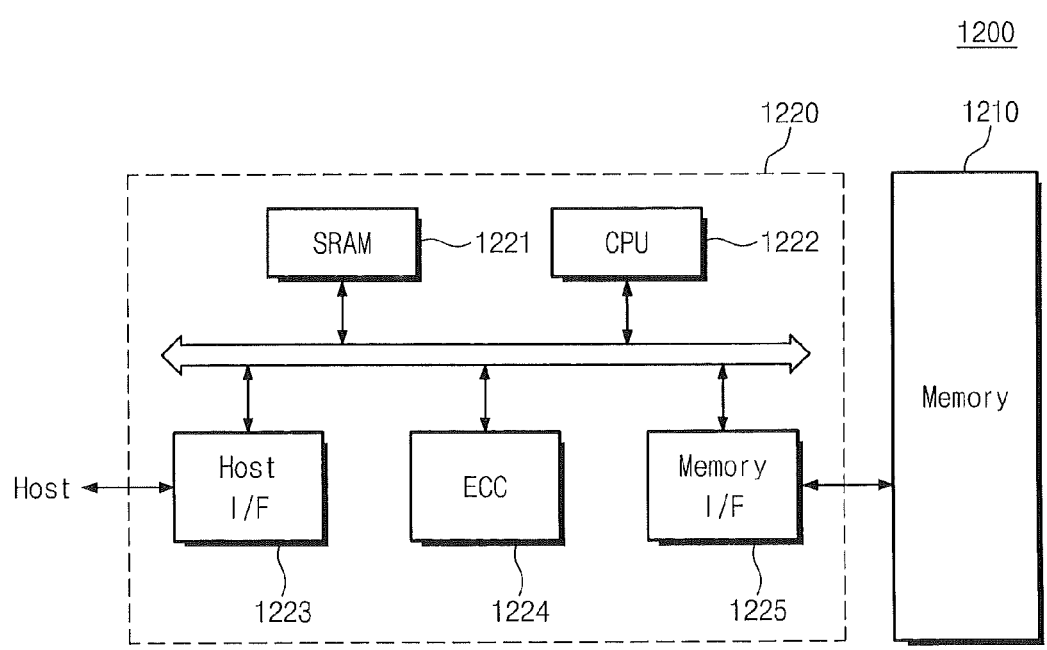
FIG. 16 is a block diagram illustrating a memory card including a semiconductor device according to an embodiment of the inventive concept.

FIG. 16 is a block diagram illustrating a memory card including a semiconductor device according to an embodiment of the inventive concept.

Referring to FIG. 16, a memory card 1200 for supporting high-capacity data storage includes a memory device 1210 including a semiconductor device according to an embodiment of the inventive concept. The memory card 1200 includes a memory controller 1220 for controlling various general data exchanges between a host and the memory device 1210.

A static random access memory (SRAM) 1221 is used as a working memory of a central processing unit (CPU) 1222 as a processing unit. A host interface (I/F) 1223 includes a data exchange protocol of a host connected to the memory card 1200. An error correction code (ECC) block 1224 detects and corrects an error in data read from the memory device 1210 having multi-bit characteristics. A memory interface (I/F) 1225 interfaces with the memory device 1210 including a semiconductor device according to an embodiment of the inventive concept. The central processing unit 1222 performs various general control operations for data exchange of the memory controller 1220. Although not illustrated in the drawings, the memory card 1200 may further include a read only memory (ROM, not shown) for storing code data to interface with a host.

As described above, a semiconductor device, a memory card, or a memory system according to embodiments of the inventive concept can provide a high-integrated memory system. Specifically, a currently studied memory system such as a solid state drive (SSD) may be provided with a semiconductor device according to embodiments of the inventive concept. In this case, a high integrated memory system may be formed.

Figure 17:
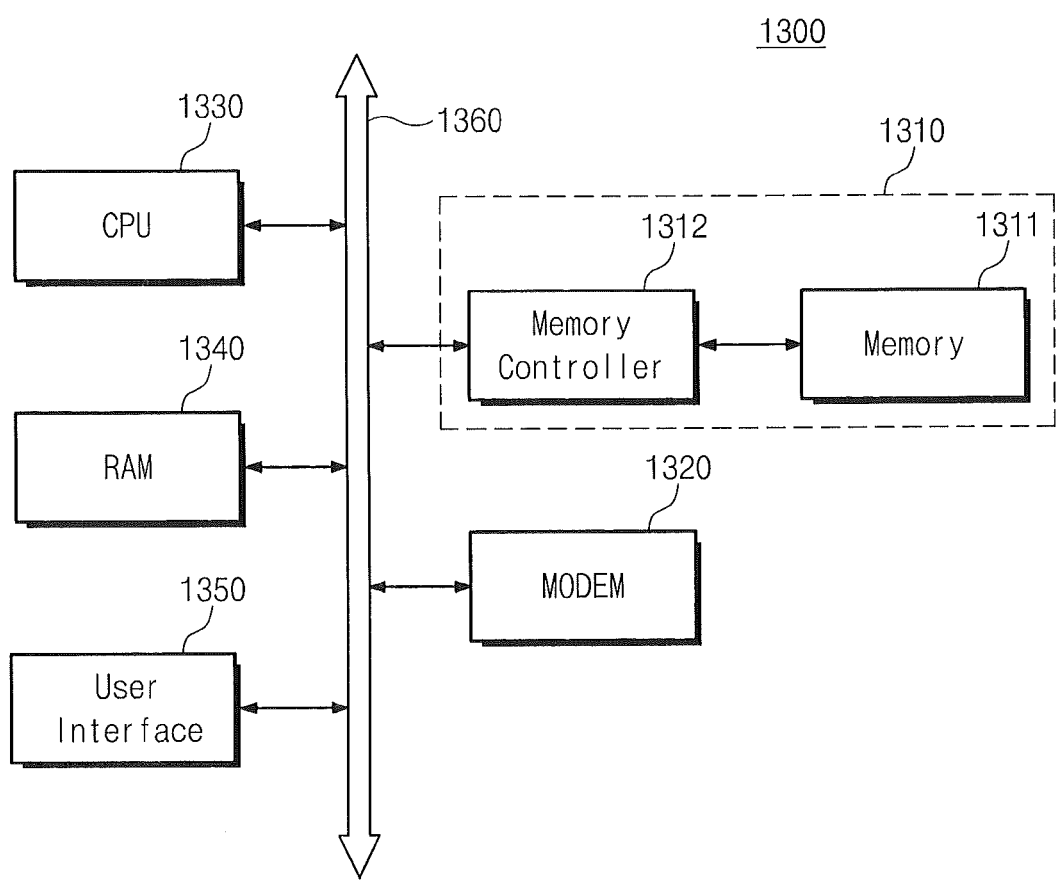
FIG. 17 is a block diagram illustrating an information processing system equipped with a semiconductor device according to an embodiment of the inventive concept.

FIG. 17 is a block diagram illustrating an information processing system equipped with a semiconductor device according to an embodiment of the inventive concept.

Referring to FIG. 17, an information processing system 1300 according to the current embodiment such as a mobile device or a desktop computer is equipped with a memory system 1310 that includes: a semiconductor device 1311; and a memory controller 1312 for controlling exchange of various types of general data between a system bus 1360 and the semiconductor device 1311. The information processing system 1300 includes a memory system 1310, a modulator and demodulator (MODEM) 1320, a central processing unit 1330, a RAM 1340, and a user interface 1350, which are individually and electrically connected to a system bus 1360. The memory system 1310 may have the substantially same configuration as that of the memory system illustrated in FIG. 15. The memory system 1310 stores data processed by the central processing unit 1330 or data input from the outside. The memory system 1310 may be configured by a solid state drive. In that case, the information processing system 1300 can stably store a high capacity data in the memory system 1310. Moreover, as its reliability is enhanced, the memory system 1310 can save a resource consumed for an error correction, so as to provide a high speed data exchange function to the information processing system 1300. Although not illustrated in the drawings, the information processing system 1300 may further include an application chipset, an image signal processor (ISP) for a camera, and an input/output device.

Furthermore, a memory device or memory system including a semiconductor device according to embodiments of the inventive concept may be mounted on various types of packages. For example, a memory device or memory system according to embodiments of the inventive concept may be packaged and mounted using a method such as Package on Package (PoP), Ball Grid Arrays (BGAs), Chip Scale Packages (CSPs), Plastic Leaded Chip Carrier (PLCC), Plastic Dual In-line Package (PDIP), die in waffle pack, die in wafer form, Chip On Board (COB), CERamic Dual In-line Package (CERDIP), plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), Thin Quad Flat Pack (TQFP), System In Package (SIP), Multi Chip Package (MCP), Wafer-level Fabricated Package (WFP), or Wafer-level processed Stack Package (WSP).

As described above, a semiconductor device according to an embodiment of the inventive concept includes air gaps defined between a semiconductor fin and a lower gate part of a gate electrode, thereby reducing or minimizing a fringing field. Thus, a capacitance according to the fringing field is reduced or minimized, thereby providing a semiconductor device having an improved alternating current performance and a method of fabricating the semiconductor device.

In addition, a second interlayer dielectric layer having a low dielectric constant is disposed between first contact plugs and an upper gate part of the gate electrode, and distances between the first contact plugs and the upper gate part of the gate electrode are large, thereby reducing or minimizing parasitic capacitance therebetween. Because the parasitic capacitance is minimized, a semiconductor device having an improved alternating current performance and a method of fabricating the semiconductor device can be provided.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A semiconductor device comprising:
   a gate electrode crossing over a semiconductor fin disposed on a substrate;
   a gate dielectric layer disposed between the gate electrode and the semiconductor fin;
   a channel region having a three dimensional structure defined in the semiconductor fin under the gate electrode;
   impurity regions disposed in the semiconductor fin at both sides of the gate electrode and spaced apart from the gate electrode;
   a first interlayer dielectric layer covering a surface of the substrate, except for the gate electrode;
   first contact plugs passing through the first interlayer dielectric layer and contacting the impurity regions; and
   a second interlayer dielectric layer covering the gate electrode and partially filling a space between the gate electrode and the impurity regions to define an air gap interposed between the gate electrode and the impurity regions;
   wherein the gate electrode comprises a lower gate part having a constant width and an upper gate part having a width that gradually decreases from the lower gate part,
   wherein the air gap is formed between a lower portion of the lower gate part and the impurity regions, and
   wherein the second interlayer dielectric layer is formed between an upper portion of the lower part and the impurity regions.

2. The semiconductor device of claim 1, wherein the second interlayer dielectric layer has a dielectric constant lower than that of the first interlayer dielectric layer.

3. The semiconductor device of claim 1, wherein respective top surfaces of the impurity regions are higher than a top surface of the channel region.

4. The semiconductor device of claim 1, wherein the second interlayer dielectric layer partially fills a space between the lower gate part and the impurity regions.

5. The semiconductor device of claim 1, wherein the gate dielectric layer extends to a side wall of the lower gate part.

6. The semiconductor device of claim 1, further comprising:
a third interlayer dielectric layer covering the second interlayer dielectric layer and the first contact plugs; and
second contact plugs passing through the third interlayer dielectric layer to contact the first contact plugs.

7. A semiconductor device comprising:
a gate electrode crossing over a semiconductor fin disposed on a substrate;
impurity regions disposed in the semiconductor fin at both sides of the gate electrode and spaced apart from the gate electrode;
contact plugs contacting the impurity regions;
an interlayer dielectric layer covering the gate electrode and partially filling a space between the gate electrode and the impurity regions to define an air gap interposed between the gate electrode and the impurity regions;
wherein the gate electrode comprises an upper gate part and a lower gate part, the lower gate part being between the upper gate part and the substrate,
wherein the air gap is formed between a lower portion of the lower gate part and the impurity regions, and
wherein the interlayer dielectric layer formed between an upper portion of the lower gate part and the impurity regions.

8. The semiconductor device of claim 7, wherein the interlayer dielectric layer is a first interlayer dielectric layer, the semiconductor device further comprising:
a second interlayer dielectric layer covering a surface of the substrate, except for the gate electrode; and
the contact plugs passing through the first interlayer dielectric layer to contact the impurity regions.

9. The semiconductor device of claim 7, wherein adjacent sidewalls of the upper gate part and the contact plugs diverge from one another with increasing distance from the substrate.

10. The semiconductor device of claim 7, wherein the contact plugs are first contact plugs, the semiconductor device further comprising:
second contact plugs disposed on the first contact plugs, respectively;
wherein adjacent sidewalls of the second contact plugs converge towards one another with increasing distance from the substrate.

11. The semiconductor device of claim 10, wherein a top surface of the interlayer dielectric layer is above a top surface of the first contact plugs, but beneath a top surface of the second contact plugs, relative to the substrate.

12. The semiconductor device of claim 6, wherein adjacent sidewalls of the second contact plugs converge towards one another with increasing distance from the substrate.

* * * * *